US 8,969,732 B2

(12) United States Patent
Amano et al.

(10) Patent No.: US 8,969,732 B2
(45) Date of Patent: Mar. 3, 2015

(54) PRINTED WIRING BOARD

(75) Inventors: Tetsuo Amano, Ogaki (JP); Toshio Nishiwaki, Ogaki (JP)

(73) Assignee: IBIDEN Co., Ltd., Ogaki-shi (JP)

( * ) Notice: Subject to any disclaimer, the term of this patent is extended or adjusted under 35 U.S.C. 154(b) by 154 days.

(21) Appl. No.: 13/534,041

(22) Filed: Jun. 27, 2012

(65) Prior Publication Data

US 2013/0075140 A1    Mar. 28, 2013

Related U.S. Application Data

(60) Provisional application No. 61/540,200, filed on Sep. 28, 2011.

(51) Int. Cl.
| H05K 1/03 | (2006.01) |
| H05K 1/09 | (2006.01) |
| H05K 1/00 | (2006.01) |
| H05K 1/11 | (2006.01) |
| H05K 3/46 | (2006.01) |
| H05K 1/02 | (2006.01) |

(52) U.S. Cl.
CPC ............. *H05K 3/4602* (2013.01); *H05K 1/024* (2013.01); *H05K 3/4655* (2013.01); *H05K 2201/068* (2013.01); *H05K 2201/096* (2013.01)
USPC ........... 174/256; 174/255; 174/257; 174/258; 174/261

(58) Field of Classification Search
CPC . H05K 1/0206; H05K 3/0058; H05K 1/0306; H05K 3/4069; H05K 3/244; H05K 1/111; H05K 1/112
USPC .................... 174/252, 261, 255–258; 361/790
See application file for complete search history.

(56) References Cited

U.S. PATENT DOCUMENTS

| 5,652,055 | A  | * | 7/1997 | King et al. ..................... 428/343 |
| 7,164,085 | B2 | * | 1/2007 | Saiki ............................. 174/261 |

(Continued)

FOREIGN PATENT DOCUMENTS

| CN | 1893765 A   | 1/2007 |
| CN | 101112141 A | 1/2008 |

(Continued)

OTHER PUBLICATIONS http://people.ccmr.cornell.edu/~cober/MSE5420/page2/files/HyperBGADielectric.pdf.*

*Primary Examiner* — Timothy Thompson
*Assistant Examiner* — Sherman Ng
(74) *Attorney, Agent, or Firm* — Oblon, Spivak, McClelland, Maier & Neustadt, L.L.P.

(57) ABSTRACT

A printed wiring board includes a core insulation layer having via conductors through the core layer, a first structure including an interlayer insulation layer on first surface of the core layer and having via conductors through the interlayer layer in the first structure, and a second structure including an interlayer insulation layer on second surface of the core layer and having via conductors through the interlayer layer in the second structure. The interlayer layers have dielectric constants set to be 4.0 or lower for signal transmission at frequency of 1 GHz, the core layer has thermal expansion coefficient at or below Tg set lower than thermal expansion coefficients of the interlayer layers at or below Tg, the coefficient of the core layer at or below Tg is set to be 75 ppm/° C. or lower, and the conductors in the interlayer layers are stacked on the conductors in the core layer.

20 Claims, 12 Drawing Sheets

(56) References Cited

U.S. PATENT DOCUMENTS

| | | | |
|---|---|---|---|
| 7,626,829 B2* | 12/2009 | Watanabe et al. | 361/767 |
| 2007/0096328 A1* | 5/2007 | Takahashi et al. | 257/774 |
| 2008/0107863 A1* | 5/2008 | Ikeda et al. | 428/137 |
| 2008/0166497 A1* | 7/2008 | Hsu et al. | 427/552 |
| 2008/0230260 A1* | 9/2008 | Shih | 174/257 |
| 2008/0283282 A1* | 11/2008 | Kawasaki et al. | 174/258 |
| 2009/0218125 A1* | 9/2009 | Nakai et al. | 174/263 |
| 2009/0236128 A1* | 9/2009 | Tsukada et al. | 174/256 |

FOREIGN PATENT DOCUMENTS

| | | |
|---|---|---|
| CN | 101356643 A | 1/2009 |
| JP | 2002-018623 | 1/2002 |
| JP | 5445007 B2 | 3/2014 |

* cited by examiner

PRINTED WIRING BOARD

CROSS-REFERENCE TO RELATED APPLICATIONS

The present application is based on and claims the benefit of priority to U.S. Application No. 61/540,200, filed Sep. 28, 2011, the entire contents of which are incorporated herein by reference.

BACKGROUND OF THE INVENTION

1. Field of the Invention

The present invention relates to a printed wiring board made by laminating multiple interlayer insulation layers on both surfaces of a core insulation layer.

2. Discussion of the Background

In recent years, LSIs have been operated at high frequencies to respond to transmission/reception of broadband electrical signals. In Japanese Laid-Open Patent Publication No. 2002-18623, a wiring board is described in which a curable polyphenylene ether resin composition is used. The entire contents of this publication are incorporated herein by reference.

SUMMARY OF THE INVENTION

According to one aspect of the present invention, a printed wiring board includes a core insulation layer having via conductors including a plating material filling holes formed through the core insulation layer, a first laminated structure including an interlayer insulation layer formed on a first surface of the core insulation layer and having via conductors including a plating material filling holes formed through the interlayer insulation layer in the first laminated structure, and a second laminated structure including an interlayer insulation layer formed on a second surface of the core insulation layer on the opposite side of the first surface of the core insulation layer and having via conductors including a plating material filling holes formed through the interlayer insulation layer in the second laminated structure. The interlayer insulation layers in the first and second laminated structures have dielectric constants which are set to be 4.0 or lower for a signal transmission at a frequency of 1 GHz, the core insulation layer has a thermal expansion coefficient at or below Tg which is set lower than a thermal expansion coefficient of the interlayer insulation layers at or below Tg, the thermal expansion coefficient of the core insulation layer at or below Tg is set to be 75 ppm/° C. or lower, the via conductors in the interlayer insulation layer of the first laminated structure are stacked on the via conductors in the core insulation layer, respectively, and the via conductors in the interlayer insulation layer of the second laminated structure are stacked on the via conductors in the core insulation layer, respectively.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIGS. 2(A)-2(G) are views showing manufacturing steps of a printed wiring board according to the first embodiment;

FIGS. 3(A)-3(D) are views showing manufacturing steps of a printed wiring board according to the first embodiment;

FIGS. 4(A)-4(C) are views showing manufacturing steps of a printed wiring board according to the first embodiment;

FIGS. 5(A)-5(B) are views showing manufacturing steps of a printed wiring board according to the first embodiment;

FIGS. 6(A)-6(B) are views showing manufacturing steps of a printed wiring board according to the first embodiment;

FIGS. 7(A)-7(G) are views showing manufacturing steps of a printed wiring board according to a modified example of the first embodiment;

FIGS. 8(A)-8(D) are views showing manufacturing steps of a printed wiring board according to a second modified example of the first embodiment;

FIGS. 12(A)-12(B) are microscopic photographs of via conductors with cracking.

DETAILED DESCRIPTION OF THE EMBODIMENTS

The embodiments will now be described with reference to the accompanying drawings, wherein like reference numerals designate corresponding or identical elements throughout the various drawings.

First Embodiment

Figure 1:
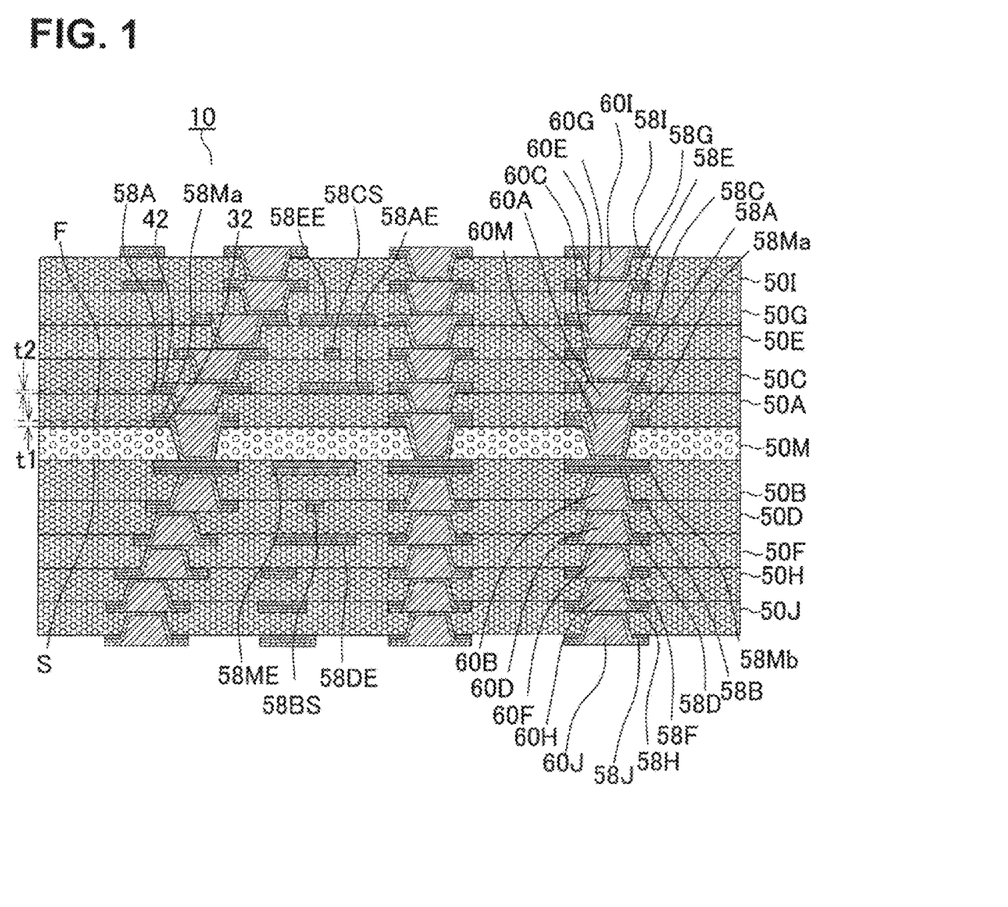
FIG. 1 is a cross-sectional view of a printed wiring board according to a first embodiment of the present invention.
Figure 2:
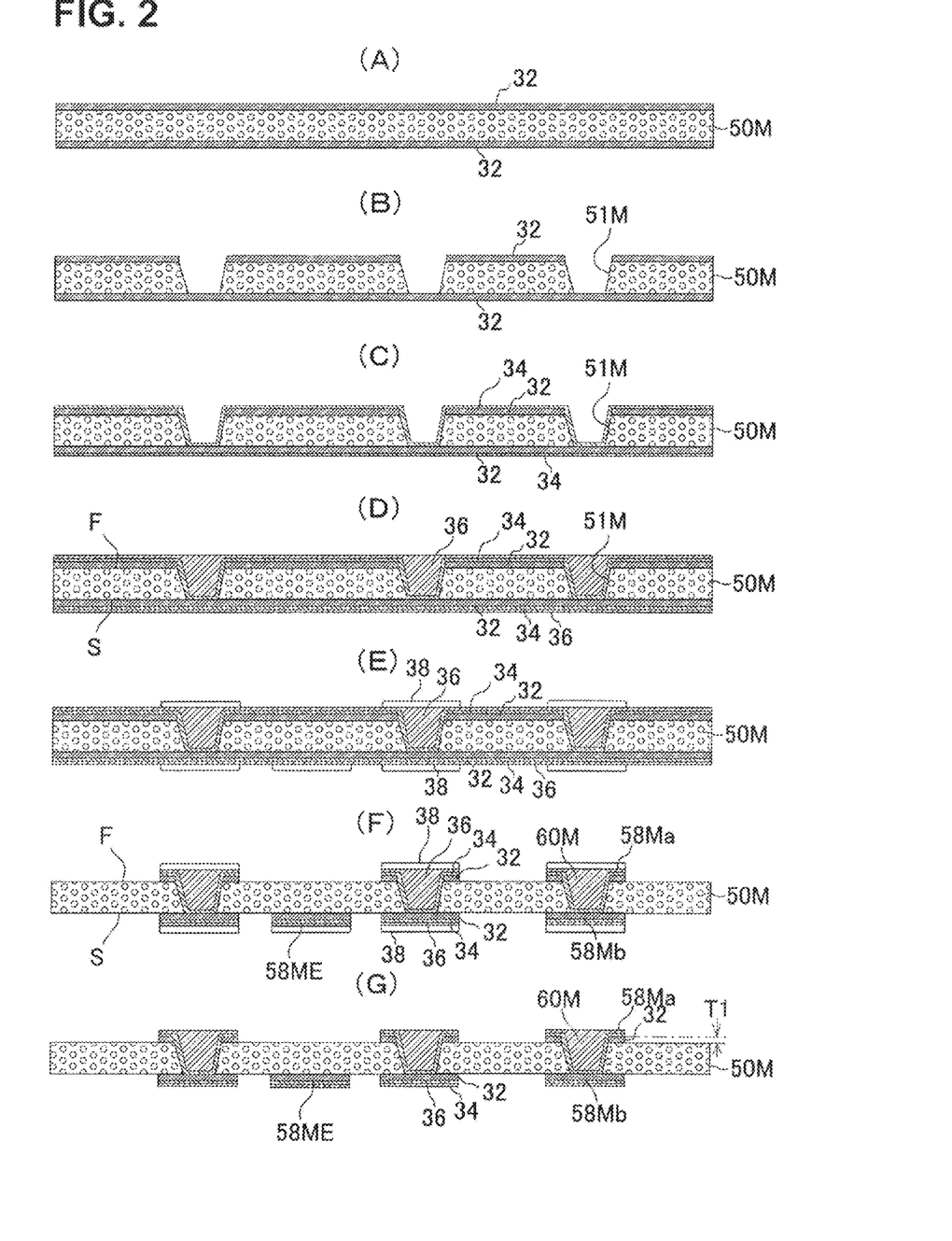
Figure 3:
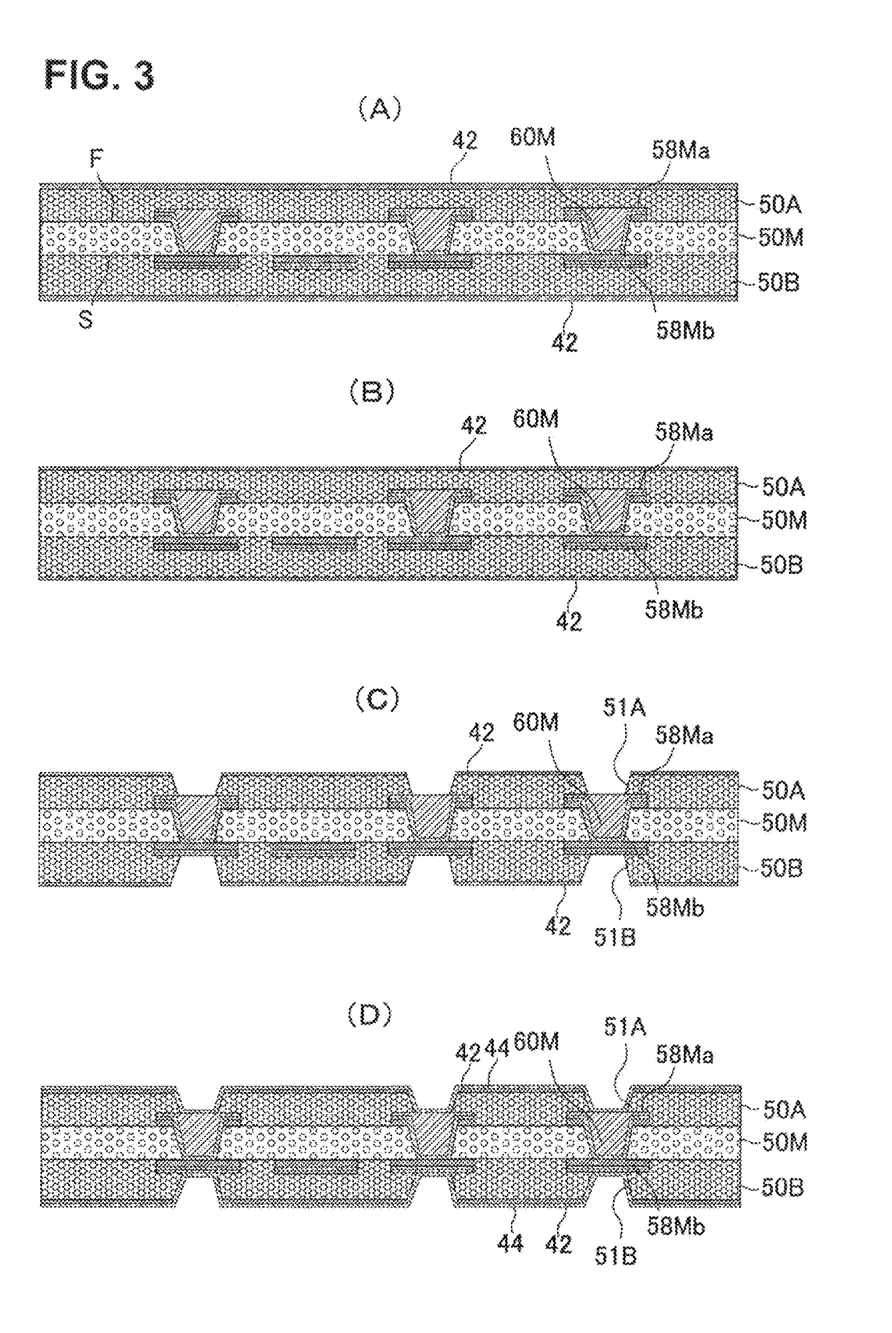
Figure 4:
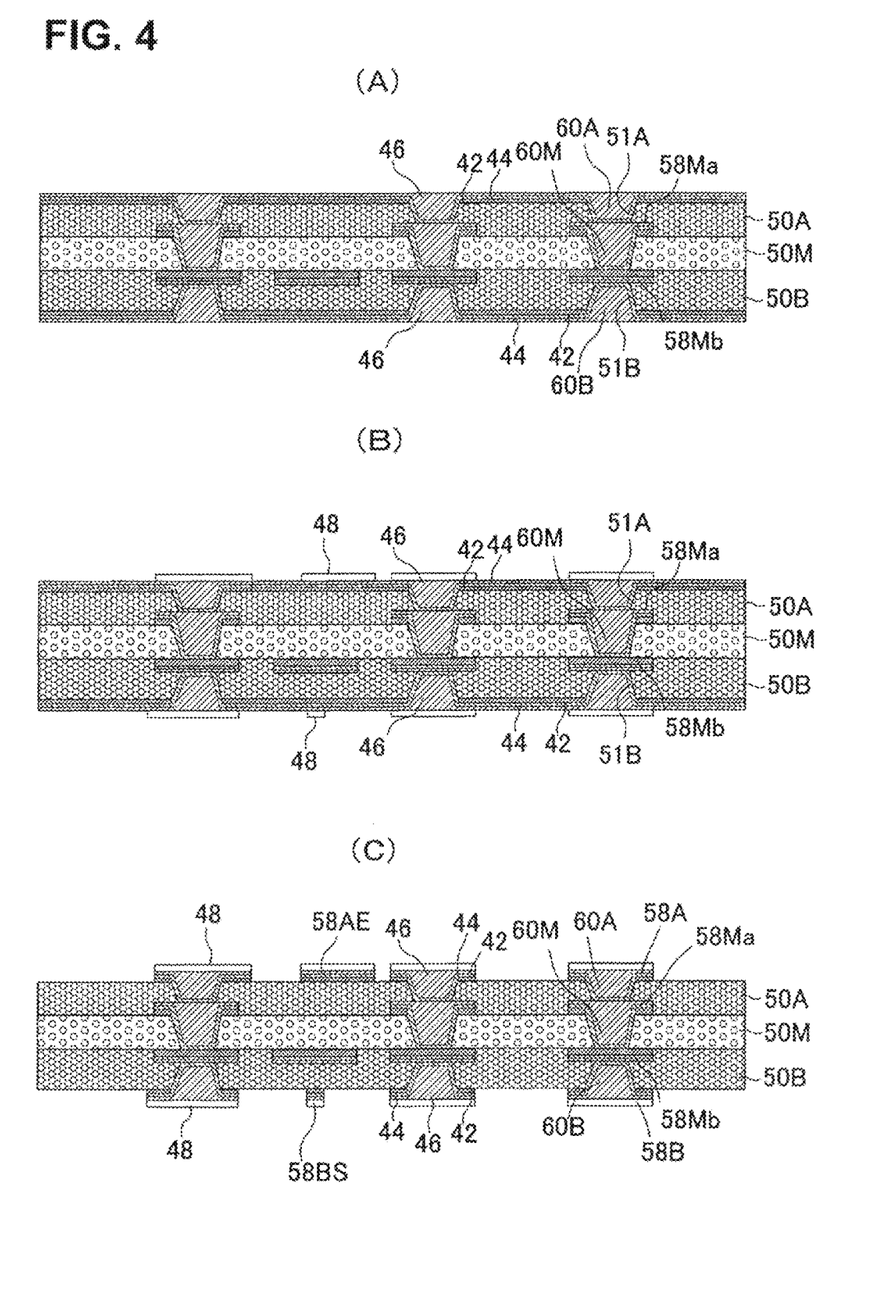
Figure 5:
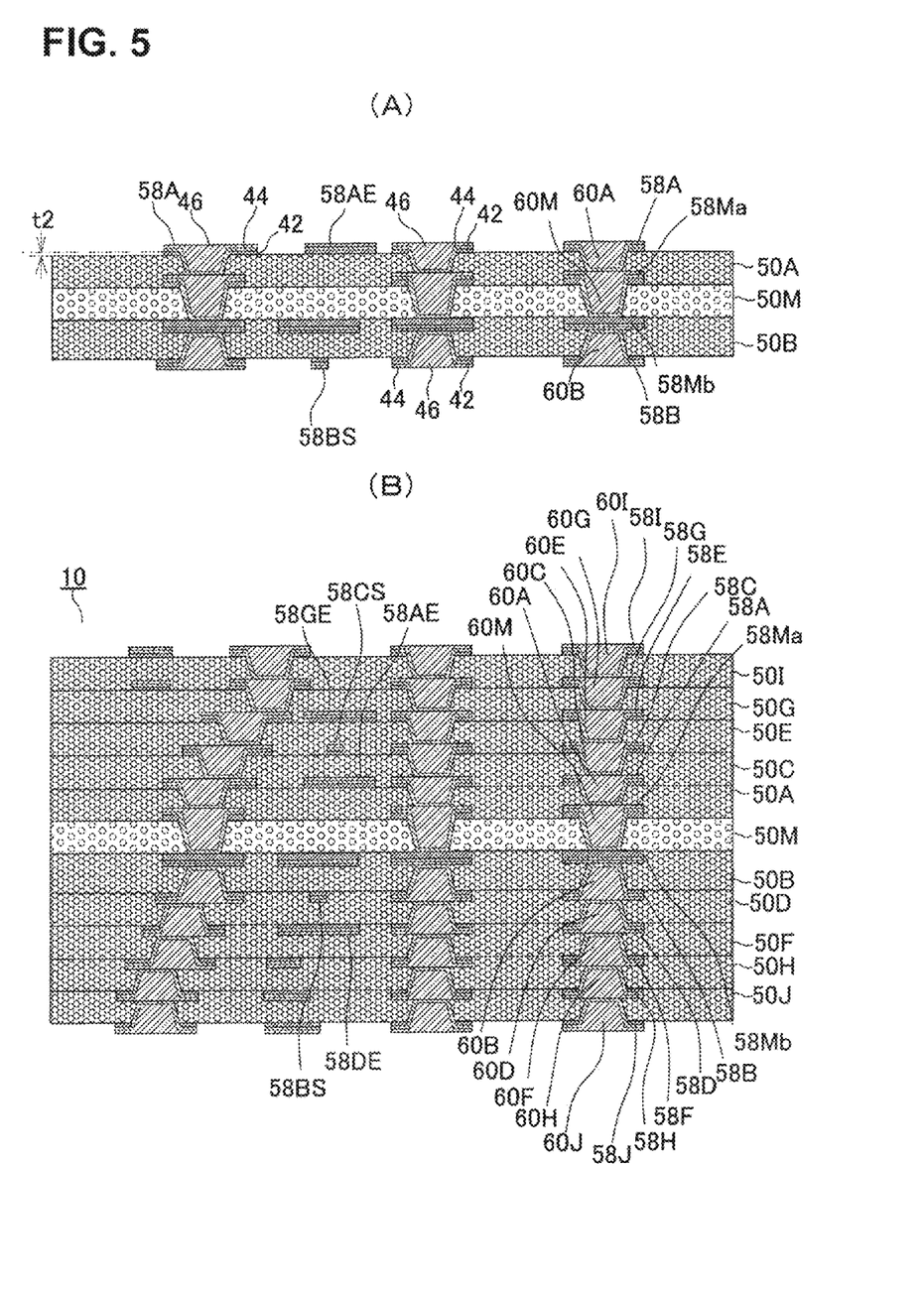
Figure 6:
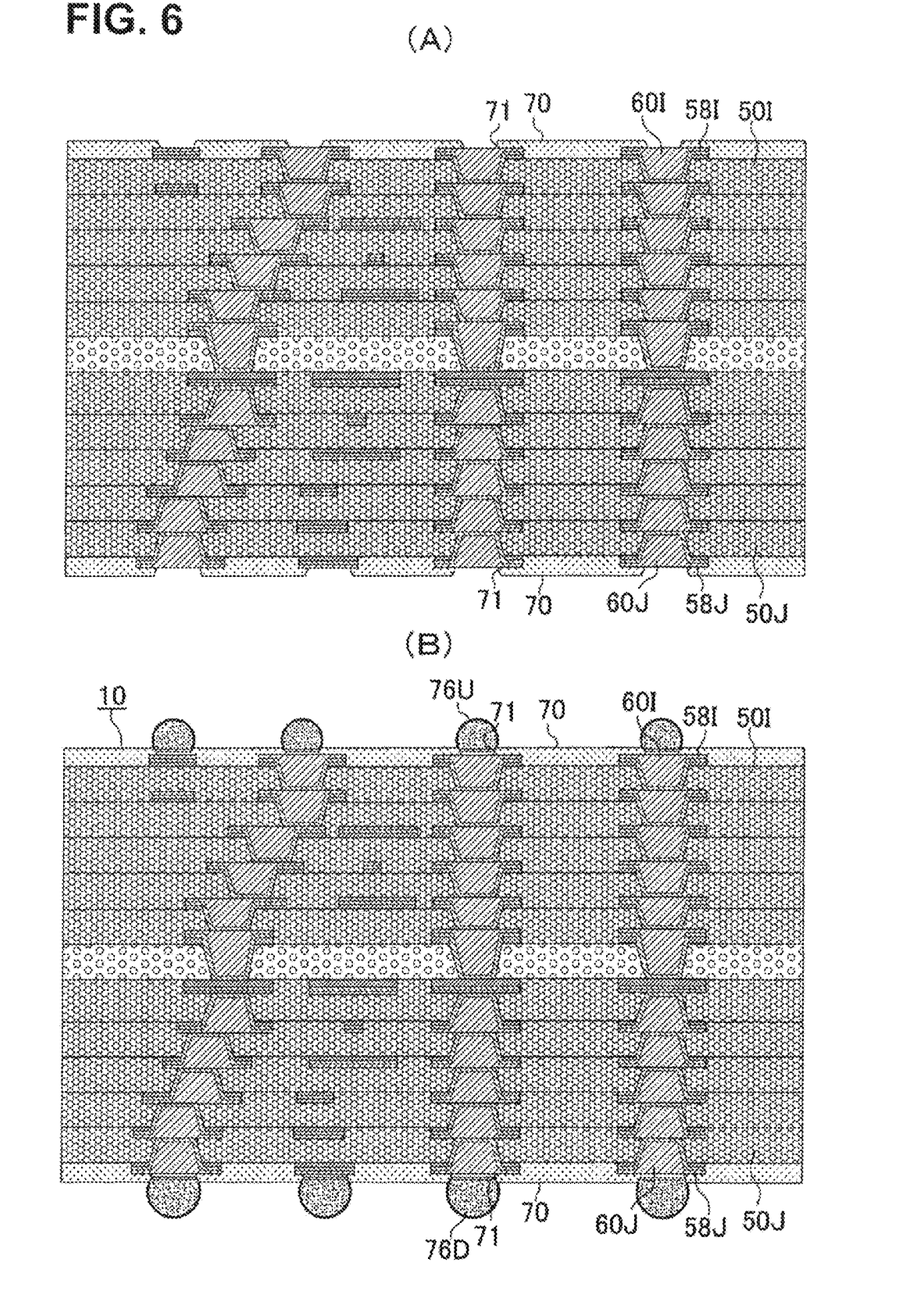

FIG. 1 is a cross-sectional view of a printed wiring board according to a first embodiment. FIGS. 2~5 show manufacturing steps of such a printed wiring board.

In printed wiring board 10, interlayer insulation layers (50A, 50C, 50E, 50G, 50I) are laminated on the first-surface (F) side of core insulation layer (50M) positioned in the center, and interlayer insulation layers (50B, 50D, 50F, 50H, 50J) are laminated on the second-surface (S) side. Conductive circuit (58Ma) on first surface (F) of core insulation layer (50M) and conductive circuit (58Mb) on second surface (S) are connected by via conductor (60M). Via conductor (60M) is formed by filling copper plating in opening 51 formed in the core insulation layer (see FIG. 2(D)). Conductive circuit (58Ma) on first surface (F) is made of copper foil 32 on the core insulation layer, electroless plated film 34 and electrolytic plated film 36 (see FIG. 2(G)). Conductive circuit (58Mb) on the second-surface (S) side is made of copper foil 32 on the core insulation layer, electroless plated film 34 and electrolytic plated film 36 (see FIG. 2(G)). On the second-surface (S) side of core insulation layer (50M), ground layer (58ME) is further formed to structure a stripline. Conductive circuit (58A) on interlayer insulation layer (50A) is made of copper foil 42 on the interlayer insulation layer, electroless plated film 44 and electrolytic plated film 46 (see FIG. 5(A)). Here, thickness (t1) of copper foil 32 of conductive circuit (58Ma) on the core insulation layer shown in FIG. 2(G) is set at 8 μm, and thickness (t2) of copper foil 42 of conductive circuit (58A) shown in FIG. 5(A) is set at 4 μm.

In interlayer insulation layer (50A) laminated on the first-surface (F) side of core insulation layer (50M), via conductor (60A) is formed to connect conductive circuit (58A) on interlayer insulation layer (50A) to conductive circuit (58Ma) on core insulation layer (50M). In interlayer insulation layer (50C) laminated on interlayer insulation layer (50A), via conductor (60C) is formed to connect conductive circuit (58C) on interlayer insulation layer (50C) to conductive circuit (58A) on interlayer insulation layer (50A). In interlayer insulation layer (50E) laminated on interlayer insulation layer (50C), via conductor (60E) is formed to connect conductive circuit (58E) on interlayer insulation layer (50E) to conductive circuit (58C) on interlayer insulation layer (50C). In interlayer insulation layer (50G) laminated on interlayer insulation layer (50E), via conductor (60G) is formed to connect conductive circuit (58G) on interlayer insulation layer (50G) to conductive circuit (58E) on interlayer insulation layer (50E). In interlayer insulation layer (50I) laminated on interlayer insulation layer (50G), via conductor (60I) is formed to connect conductive circuit (58I) on interlayer insulation layer (50I) to conductive circuit (58G) on interlayer insulation layer (50G).

In interlayer insulation layer (50B) laminated on the second-surface (S) side of core insulation layer (50M), via conductor (60B) is formed to connect conductive circuit (58B) on interlayer insulation layer (50B) to conductive circuit (58Mb) on core insulation layer (50M). In interlayer insulation layer (50D) laminated on interlayer insulation layer (50B), via conductor (60D) is formed to connect conductive circuit (58D) on interlayer insulation layer (50D) to conductive circuit (58B) on interlayer insulation layer (50B). In interlayer insulation layer (50F) laminated on interlayer insulation layer (50D), via conductor (60F) is formed to connect conductive circuit (58F) on interlayer insulation layer (50F) to conductive circuit (58D) on interlayer insulation layer (50D). In interlayer insulation layer (50H) laminated on interlayer insulation layer (50F), via conductor (60H) is formed to connect conductive circuit (58H) on interlayer insulation layer (50H) to conductive circuit (58F) on interlayer insulation layer (50F). In interlayer insulation layer (50J) laminated on interlayer insulation layer (50H), via conductor (60J) is formed to connect conductive circuit (58J) on interlayer insulation layer (50J) to conductive circuit (58H) on interlayer insulation layer (50H).

As described above, ground layer (58ME) is formed on the second-surface side of core insulation layer (50M). Also, ground layer (58DE) is formed on second-surface side interlayer insulation layer (50D). Both ground layers (58ME, 58DE) structure a stripline for signal line (58BS) positioned on interlayer insulation layer (50B). In the same manner, ground layer (58AE) is formed on first-surface side interlayer insulation layer (50A). Also, ground layer (58EE) is formed on first-surface side interlayer insulation layer (50E). Both ground layers (58AE, 58EE) structure a stripline for signal line (58CS) positioned on interlayer insulation layer (50C).

In a printed wiring board of the first embodiment, core insulation layer (50M) is made of epoxy resin containing glass-cloth core material and inorganic filler, and its thermal expansion coefficient at or below Tg (glass transition temperature) is set to be 75 ppm/° C. or lower, preferably 55 ppm/° C. or lower. On the other hand, interlayer insulation layers (50A~50J) are made of thermosetting polyphenylene ether resin containing glass-cloth core material; their dielectric constant at 1 GHz is set to be 4.0 or lower, and their thermal expansion coefficient at or below Tg is set to be 75 ppm/° C. or lower. As described above, thickness (t1) of copper foil 32 of conductive circuit (58Ma) on the core insulation layer is 8 μm, and thickness (t2) of copper foil 42 of conductive circuit (58A) is 4 μm.

The printed wiring board according to the first embodiment is formed by laminating multiple interlayer insulation layers (50A~50J) on both surfaces of core insulation layer (50M). Since the dielectric constant of the interlayer insulation layers at 1 GHz is 4.0 or lower, required impedance characteristics are obtained without employing skip layers using multiple interlayer insulation layers when a stripline structure is formed, or without reducing wiring thickness to such a degree that would decrease production yield. On the other hand, the interlayer insulation layers with a low dielectric constant have a high thermal expansion coefficient in direction Z, and thus the core insulation layer positioned in the center is affected by stress from the interlayer insulation layers. Accordingly, by using a type of resin that has a low thermal expansion coefficient and high rigidity for the core insulation layer, the amount of thermal expansion of the core insulation layer decreases, thus reducing the stress on via conductors in the core insulation layer exerted from the core insulation layer which receives stress from the via conductors in the interlayer insulation layers. Accordingly, the connection reliability of the via conductors is enhanced.

In addition, interlayer insulation layers with a low dielectric constant have a high thermal expansion coefficient in direction Z, and stress from the interlayer insulation layers concentrates on core insulation layer (50M) positioned in the center. Thickness (t1) of copper foil 32 of conductive circuits (58Ma, 58Mb) on both surfaces of the core insulation layer is set greater than thickness (t2) of copper foil 42 of conductive circuits on interlayer insulation layers to increase rigidity. Accordingly, when stress is exerted, via conductors (60M) in the core insulation layer are prevented from being separated from copper foil 42, and the connection reliability of the via conductors is secured.

In the printed wiring board of the first embodiment, the thickness of copper foil 32 of conductive circuit (58Ma, 58Mb) on core insulation layer (50M) is set at 5 μm or greater. Therefore, separation of via conductors (60M) is prevented when stress is exerted, and the connection reliability of the via conductors is secured.

In the printed wiring board of the first embodiment, via conductors (60I, 60G, 60E, 60C, 60A) in first-surface side interlayer insulation layers (50I, 50G, 50E, 50C, 50A), via conductor (60M) in core insulation layer (50M), and via conductors (60B, 60D, 60F, 60H, 60J) in second-surface side interlayer insulation layers (50B, 50D, 50F, 50H, 50J) are stacked. Therefore, stress from the via conductors in interlayer insulation layers (50I, 50G, 50E, 50C, 50A, 50B, 50D, 50F, 50H, 50J) concentrates on via conductor (60M) in the core insulation layer positioned in the center. Accordingly, copper foil 32 of conductive circuits (58Ma, 58Mb) on both surfaces of the core insulation layer is set thicker so that separation of via conductors (60M) in the core insulation layer is prevented when stress is exerted and connection reliability of the via conductors is secured.

In the printed wiring board of the first embodiment, a stripline is structured using a first conductive layer on the core insulation layer and/or a second conductive layer. Since the dielectric constant of the interlayer insulation layers at 1 GHz is 4.0 or lower, required impedance characteristics are obtained without employing skip layers using multiple interlayer insulation layers.

In the printed wiring board of the first embodiment, since the interlayer insulation layers contain polyphenylene ether or its dielectric, their dielectric constant at 1 GHz can be set at 4.0 or lower, and transmission delay and transmission loss of electrical signals are reduced.

In the printed wiring board of the first embodiment, the thermal expansion coefficient of the core insulation layer can be set at 55 ppm/° C. or lower since it contains inorganic filler. In addition, its rigidity is enhanced, and the reliability of the via conductors formed in core insulation layer (50M) is enhanced.

A method for manufacturing a printed wiring board of the first embodiment is shown in FIGS. 2~6.

(1) A double-sided copper-clad laminate is a starting material, where 8 μm-thick copper foils 32 are laminated on both surfaces of core insulation layer (50M) formed by curing 0.15 mm-thick prepreg made of epoxy resin containing glass-cloth core material and inorganic filler. First, black-oxide treatment is conducted on surfaces of copper foils 32 (FIG. 2(A)). Here, the thickness of copper foils 32 may be adjusted to be 8 μm by laminating 12 μm-thick copper foils and light etching the foils.

(2) A CO2 laser is irradiated at the first-surface (F) side of core insulation layer (50M) from first-surface (F) toward second surface (S) to form opening portions (51M) reaching second-surface side copper foil 32 (FIG. 2(B)).

(3) After desmearing is conducted on openings (51M) using permanganic acid, electroless plating is performed to form electroless plated film 34 (FIG. 2(C)), and electrolytic plated film 36 is further formed. Accordingly, via conductors (60M) made by filling plating in opening portions (51M) are formed (FIG. 2(D)).

(4) Etching resists 38 with predetermined patterns are formed on electrolytic plated films 36 on surfaces of core insulation layer (50M) (FIG. 2(E)).

(5) From portions where no etching resist is formed, electrolytic plated film 36, electroless plated film 34 and copper foil 32 on the first-surface side are removed, and electrolytic plated film 36, electroless plated film 34 and copper foil 32 on the second-surface side are removed (FIG. 2(F)). Then, the etching resists are removed so that core insulation layer (50M) having conductive circuits (58Ma, 58Mb) and via conductors (60M) is completed (FIG. 2(G)).

(6) Interlayer insulation layer (50A) made by impregnating glass-cloth core material with thermosetting polyphenylene ether resin and 8 μm-thick copper foil 42 are laminated on the first-surface (F) side of core insulation layer (50M); and interlayer insulation layer (50B) made by impregnating glass-cloth core material with thermosetting polyphenylene ether resin and 8 μm-thick copper foil 42 are laminated on the second-surface (S) side (FIG. 3(A)).

(7) The thickness of copper foils 42 is adjusted to be 4 μm through light etching (FIG. 3(B)), and a black-oxide treatment is conducted on the copper foils.

(8) By irradiating a CO2 laser, opening portions (51A) reaching conductive circuits (58Ma) are formed in interlayer insulation layer (50A), and opening portions (51B) reaching conductive circuits (58Mb) are formed in interlayer insulation layer (50B) (FIG. 3(C)).

(9) After a desmearing treatment is conducted on openings (51A, 51B), electroless plating is performed to form electroless plated film 44 (FIG. 3(D)), and electrolytic plated film 46 is further formed. Accordingly, via conductors (60A, 60B) made by filling plating in opening portions (51A, 51B) are formed (FIG. 4(A)).

(10) Etching resists 48 with predetermined patterns are formed on electrolytic plated films 36 on surfaces of interlayer insulation layers (50A, 50B) (FIG. 4(B)).

(11) Electrolytic plated film 46, electroless plated film 44 and copper foil 42 are removed from the portions where no etching resist is formed (FIG. 4(C)), and the etching resists are removed. Accordingly, interlayer insulation layer (50A) having conductive circuits (58A) and via conductors (60A) as well as interlayer insulation layer (50B) having conductive circuits (58B) and via conductors (60B) is completed (FIG. 5(A)).

(12) Treatments shown in FIGS. 3~5(A) are repeated so that interlayer insulation layer (50C) having conductive circuits (58C) and via conductors (60C) as well as interlayer insulation layer (50D) having conductive circuits (58D) and via conductors (60D) is laminated; and interlayer insulation layer (50E) having conductive circuits (58E) and via conductors (60E) as well as interlayer insulation layer (50F) having conductive circuits (58F) and via conductors (60F) is laminated. Furthermore, interlayer insulation layer (50G) having conductive circuits (58G) and via conductors (60G) as well as interlayer insulation layer (50H) having conductive circuits (58H) and via conductors (60H) is laminated; and interlayer insulation layer (50I) having conductive circuits (58I) and via conductors (60I) as well as interlayer insulation layer (50J) having conductive circuits (58J) and via conductors (60J) is laminated. Accordingly, printed wiring board 10 is completed (FIG. 5(B)).

(13) A commercially available solder-resist composition is applied, exposed to light and developed. Accordingly, solder-resist layers 70 having opening portions 71 are formed (FIG. 6(A)).

(14) A 5 μm-thick nickel-plated layer is formed in opening portions 71, and a 0.03 μm-thick gold-plated layer is formed on the nickel-plated layer (not shown in the drawings).

(15) Solder balls are loaded on first-surface side opening portions 71 and second-surface side opening portions 71 followed by a reflow process. Accordingly, solder bumps (76U) are formed on the first-surface (upper-surface) side, and solder bumps (76D) are formed on the second-surface (lower-surface) side. Printed wiring board 10 is completed (FIG. 6(B)).

First Modified Example of the First Embodiment

Figure 7:
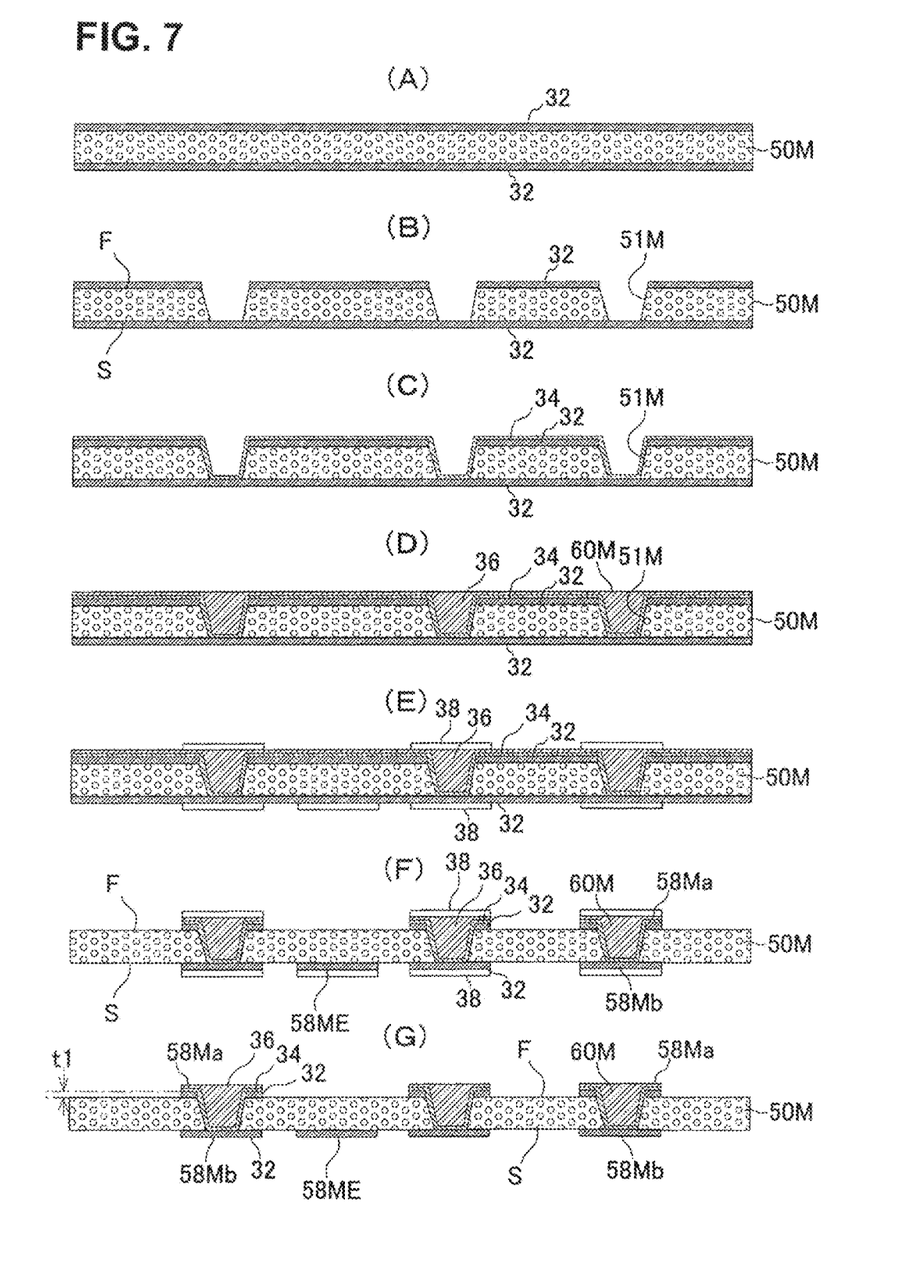

FIG. 7 shows a method for manufacturing a printed wiring board according to a modified example of the first embodiment. In the modified example of the first embodiment, electroless plated film 34 and electrolytic plated film 36 are not formed on second-surface (S) side copper foil 32 (FIGS. 7(C), 7(D)). After etching resists 38 are formed (FIG. 7(E)), electrolytic plated film 36, electroless plated film 34 and copper foil 32 on the first-surface side are removed from the portions where no etching resist is formed. Then, second-surface side copper foil 32 is removed (FIG. 7(F)), and the etching resists are removed (FIG. 7(G)). Since the subsequent steps are the same as in the first embodiment, their descriptions are omitted here.

Second Modified Example of the First Embodiment

Figure 8:
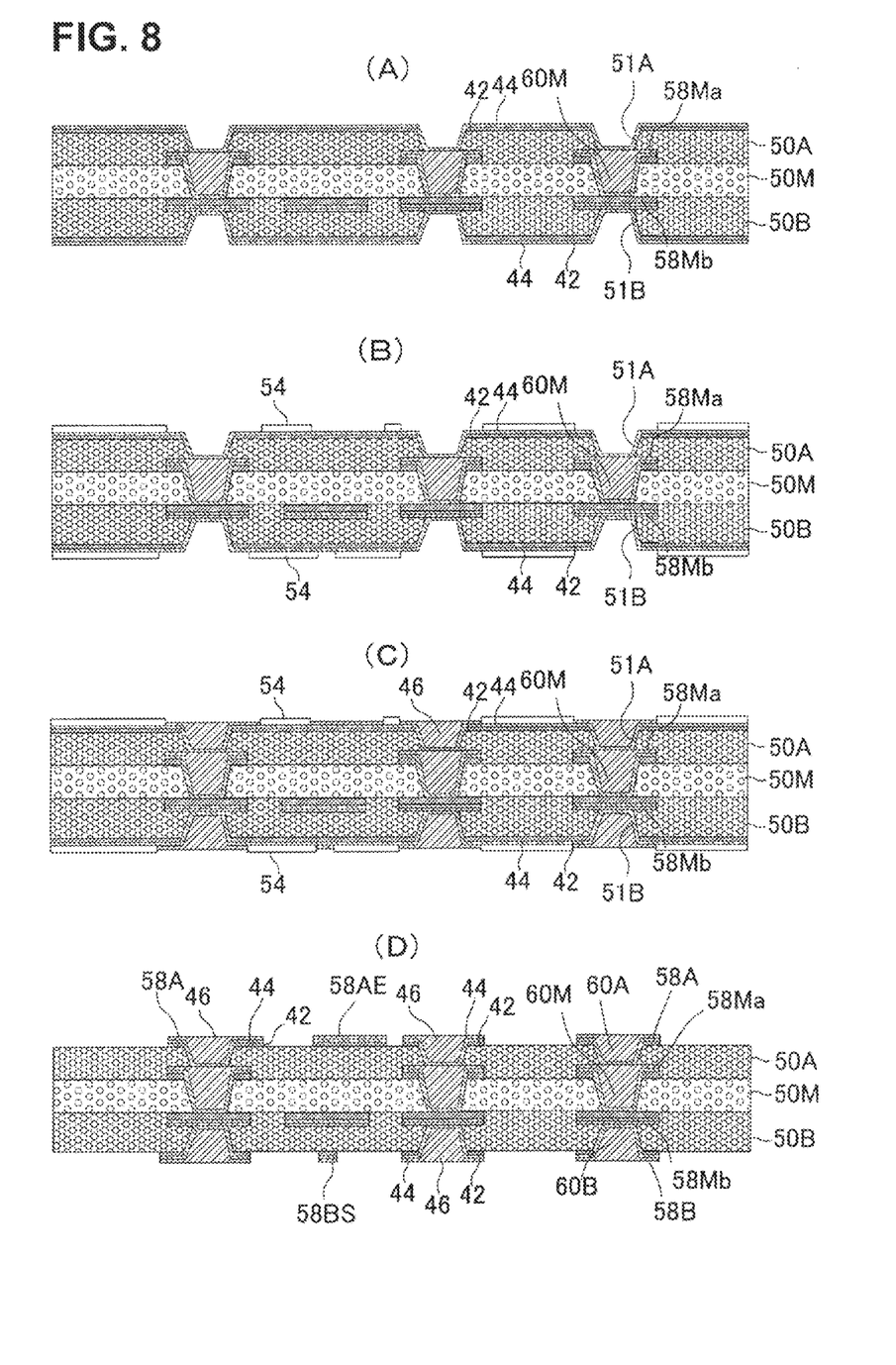

FIG. 8 shows a method for manufacturing a printed wiring board according to a second modified example of the first embodiment. In the second modified example of the first embodiment, conductive circuits are formed by a semi-additive method. Following the step described above with reference to FIG. 3(D) in the first embodiment (FIG. 8(A)), plating resists 54 with predetermined patterns are formed on the electroless plated films (FIG. 8(B)). Electrolytic plated films 46 are formed where no plating resist is formed (FIG. 8(C)). After the plating resists are removed, the electroless plated film and copper foil under the plating resists are removed, and via conductors (60A, 60B) and conductive circuits (58A, 58B) are completed (FIG. 8(D)).

Second Embodiment

Figure 9:
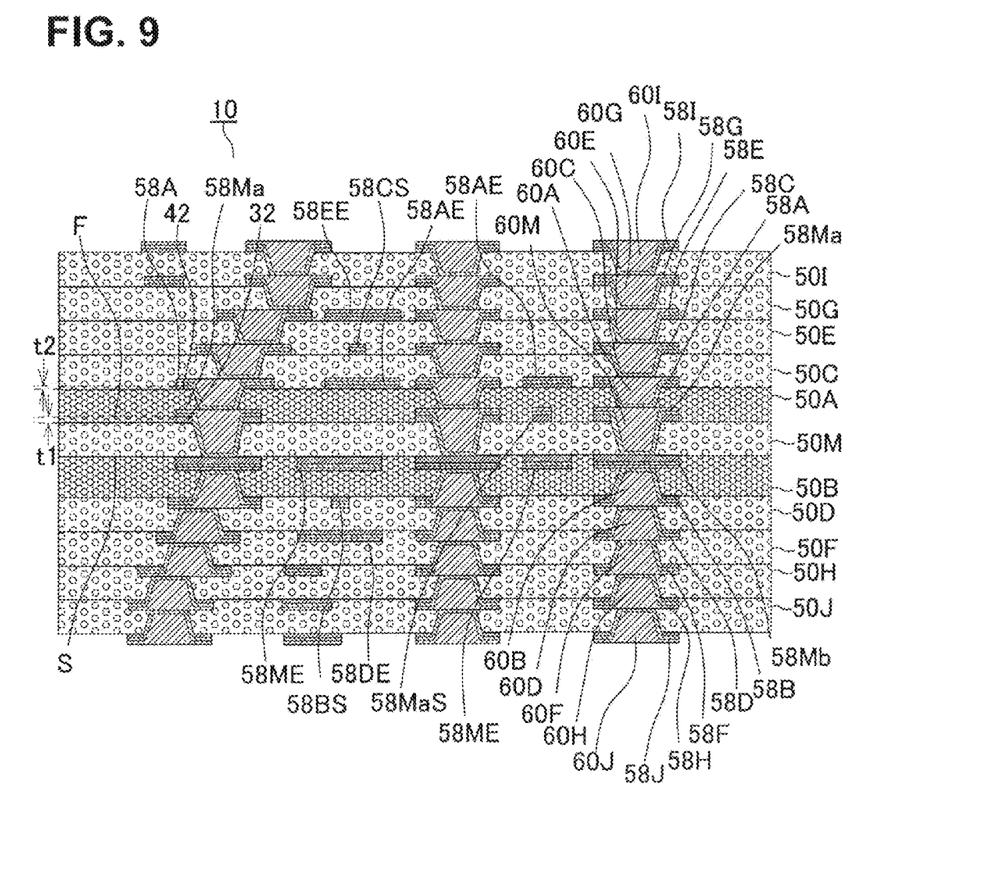
FIG. 9 is a cross-sectional view of a printed wiring board according to a second embodiment.

FIG. 9 is a cross-sectional view of a printed wiring board according to a second embodiment. In the second embodiment, interlayer insulation layers (50A, 50B) laminated on core insulation layer (50M) are made of thermosetting polyphenylene ether resin, the same as in the first embodiment. Their dielectric constant at 1 GHz is set to be 4.0 or lower, and their thermal expansion coefficient at or below Tg (glass transition temperature) is set to be 75 ppm/° C. or lower, more preferably 55 ppm/° C. or lower. On the other hand, first-surface side interlayer insulation layers (50C~50I) and second-surface side interlayer insulation layers (50D~50J) are made of glass-epoxy substrate, which is formed to have a low CTE by impregnating glass cloth with epoxy resin and by further adding inorganic particles.

In the second embodiment, signal line (58MaS) is positioned on the first-surface (F) side of core insulation layer (50M), and a stripline is structured by ground layer (58AE) on interlayer insulation layer (50A) and ground layer (58ME) on the second-surface (S) side of core insulation layer (50M).

In the second embodiment, first-surface side interlayer insulation layers (50C~50I) and second-surface side interlayer insulation layers (50D~50J) are set to have a low CTE so that stress on core insulation layer (50M) is mitigated and the reliability of via conductors (60M) is enhanced.

Third Embodiment

Figure 10:
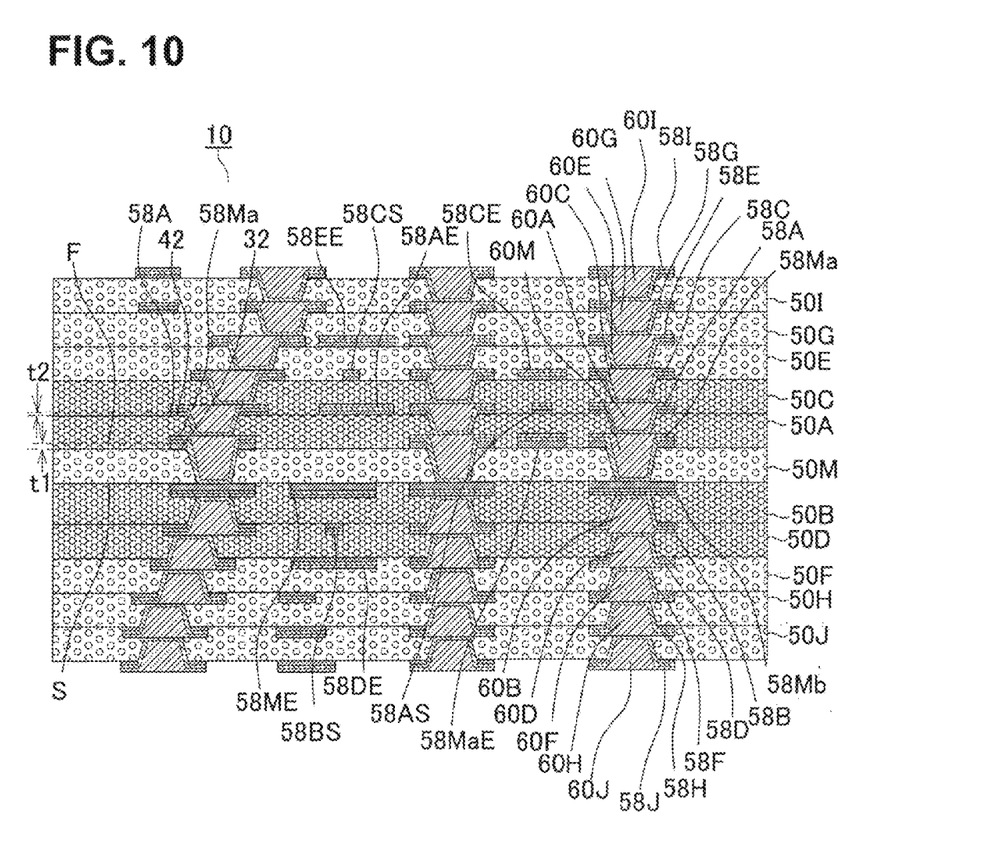
FIG. 10 is a cross-sectional view of a printed wiring board according to a third embodiment.

FIG. 10 is a cross-sectional view of a printed wiring board according to a third embodiment. In the third embodiment, two interlayer insulation layers (50A, 50C) laminated on the first-surface side of core insulation layer (50M) and two interlayer insulation layers (50B, 50D) laminated on the second-surface side are made of thermosetting polyphenylene ether resin, the same as in the first embodiment. Their dielectric constant at 1 GHz is set to be 4.0 or lower, and their thermal expansion coefficient at or below Tg (glass transition temperature) is set to be 75 ppm/° C. or lower, more preferably 55 ppm/° C. or lower. On the other hand, first-surface side interlayer insulation layers (50E~50I) and second-surface side interlayer insulation layers (50F~50J) are made of glass-epoxy substrate, which is formed to have a low CTE by impregnating glass cloth with epoxy resin and by further adding inorganic particles.

In the third embodiment, ground layer (58CE) is formed on interlayer insulation layer (50C), signal line (58AS) is formed on interlayer insulation layer (50A), and ground layer (58MaE) is positioned on the first-surface (F) side of core insulation layer (50M) to structure a stripline.

In the third embodiment, first-surface side interlayer insulation layers (50E~50I) and second-surface side interlayer insulation layers (50F~50J) are set to have a low CTE so that stress on core insulation layer (50M) is mitigated and the reliability of via conductors (60M) is enhanced.

Fourth Embodiment

Figure 11:
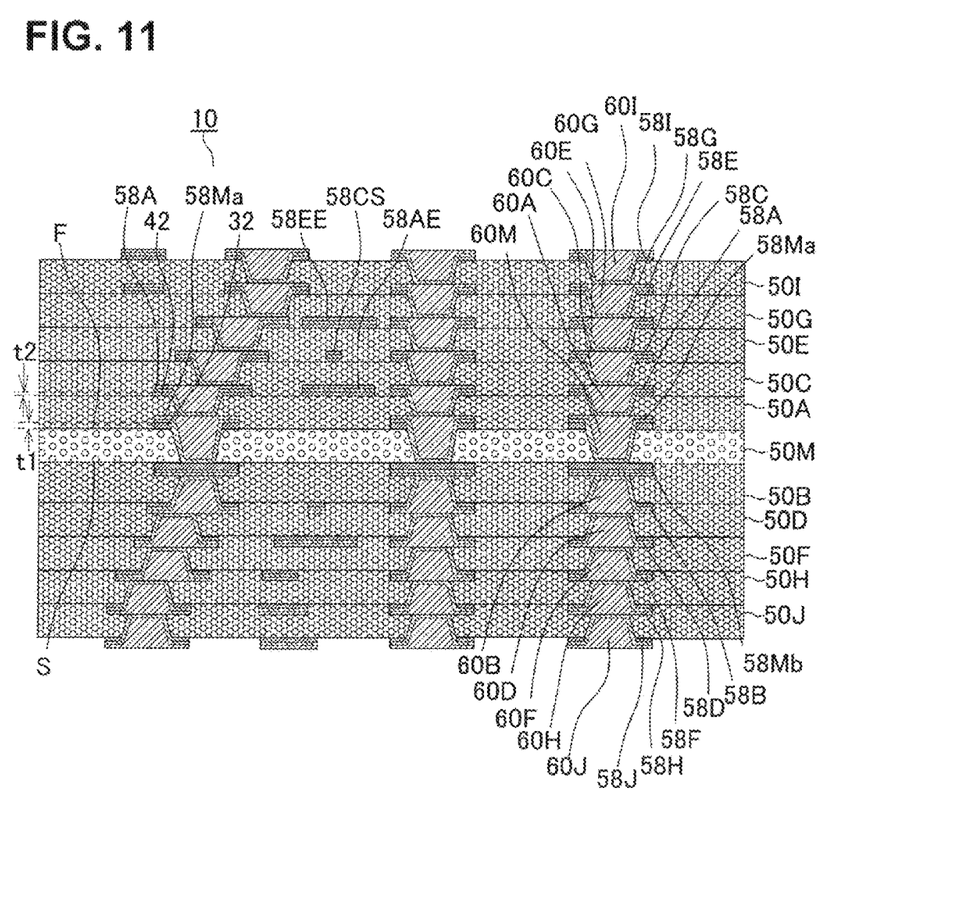
FIG. 11 is a cross-sectional view of a printed wiring board according to a fourth embodiment.

FIG. 11 is a cross-sectional view of a printed wiring board according to a fourth embodiment. In the fourth embodiment, core insulation layer (50M) includes only via lands and conductive circuits (58B) connected to via conductors.

The thermal expansion coefficient in direction Z is high in interlayer insulation layers (50A~50J) with a low dielectric constant, and stress from such interlayer insulation layers concentrates on core insulation layer (50M) positioned in the center. Therefore, thickness (t1) of copper foil 32 of conductive circuits (58Ma, 58Mb) on both surfaces of the core insulation layer is set greater than thickness (t2) of copper foil 42 of conductive circuits on the interlayer insulation layers so that rigidity is enhanced. Accordingly, via conductors (60M) in the core insulation layer are prevented from being separated from copper foil 42 when stress is exerted, and the connection reliability of the via conductors is secured.

When insulation layers made of a curable polyphenylene ether resin composition are used, resin residue tends to remain on via bottoms when via holes are formed using a laser.

In addition, when the dielectric constant of insulation layers is set lower, their thermal expansion coefficient in direction Z becomes higher, resulting in lower connection reliability of via conductors due to thermal contraction. Especially, in a multilayer printed wiring board having a full-stack via structure, stress concentrates on via conductors formed in a central core layer where stress has no channel through which to be dissipated. Accordingly, the connection reliability of the via conductors is reduced.

Figure 12:
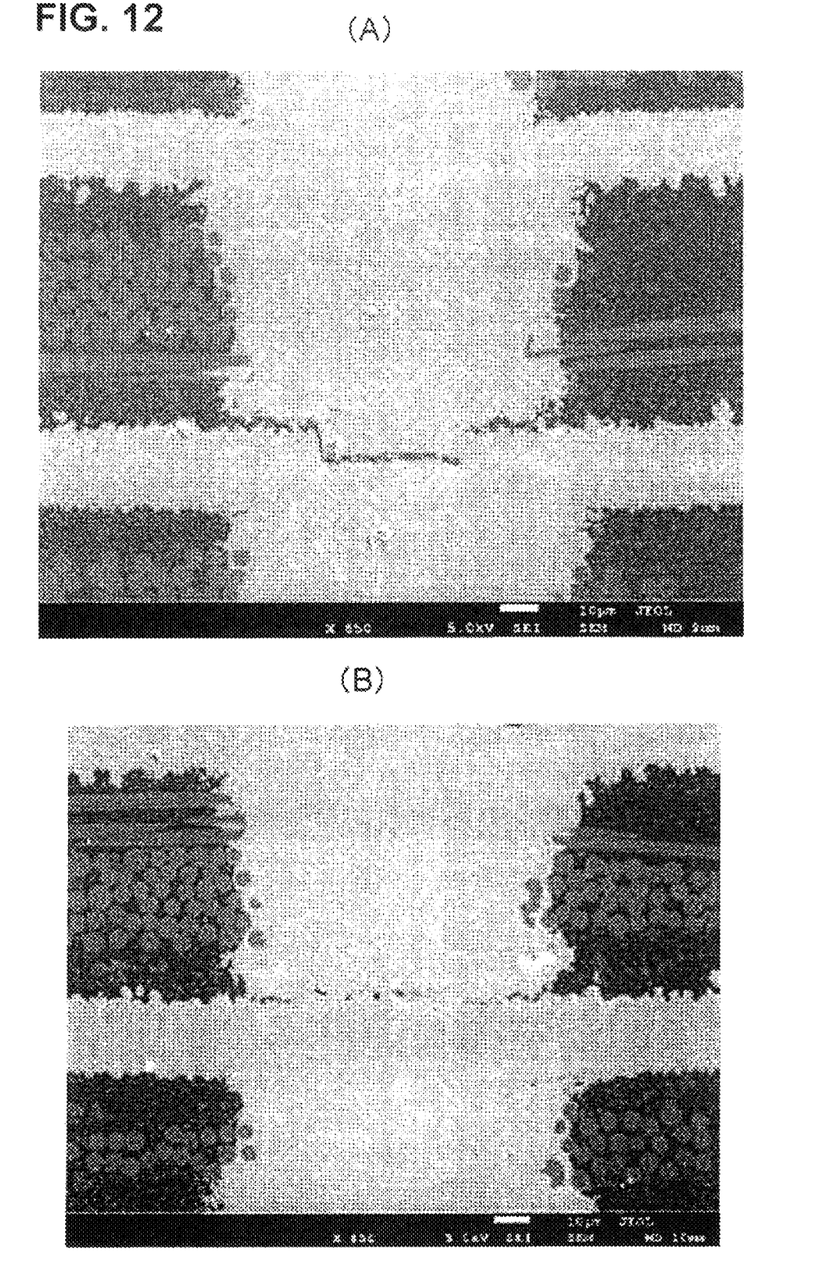

FIG. 12(A) shows a microscopic photograph of a via conductor in a core layer. Residue remains on the bottom of a via conductor and cracking is observed on a boundary surface between the plated surface and copper foil of the via conductor. In a microscopic photograph in FIG. 12(B), cracking is observed on the bottom of a via conductor due to the residue on the bottom of the via conductor.

A printed wiring board according to an embodiment of the present invention has the following: a core insulation layer with a first surface and a second surface opposite the first surface and having via conductors made by filling multiple holes with plating; and one or more interlayer insulation layers which are respectively formed on the first-surface side and on the second-surface side of the core insulation layer and have via conductors made by filling multiple holes with plating. Such a printed wiring board has the following technological features: the dielectric constant of the interlayer insulation layers at 1 GHz is set to be 4.0 or lower; the core insulation layer has a lower thermal expansion coefficient than the interlayer insulation layers, and its thermal expansion coefficient at or below Tg is set to be 75 ppm/° C. or lower; and via conductors in the first-surface side interlayer insulation layers, a via conductor in the core insulation layer and via conductors in the second-surface side interlayer insulation layers are stacked.

A printed wiring board according to an embodiment of the present invention is formed by laminating multiple interlayer insulation layers on both surfaces of a core insulation layer. The dielectric constant of such interlayer insulation layers is set to be 4.0 or lower at 1 GHz. Thus, required impedance characteristics are obtained without employing skip layers using multiple interlayer insulation layers when a stripline structure is formed, or without reducing wiring thickness to such a degree that would decrease production yield. On the other hand, in interlayer insulation layers with a low dielectric constant, their thermal expansion coefficient in direction Z is high, and the core insulation layer positioned in the center is affected by stress from the interlayer insulation layers. Therefore, by using a type of resin that has a low thermal expansion coefficient and high rigidity, the amount of thermal expansion of the core insulation layer decreases, thus reducing the stress on via conductors in the core insulation layer exerted from the core insulation layer which receives stress from the via conductors in the interlayer insulation layers. Accordingly, the connection reliability of the via conductors is enhanced.

In a printed wiring board according to another embodiment of the present invention, by increasing the thickness of copper foil of the first conductive layers on both surfaces of the core insulation layer to improve rigidity, via conductors in the core insulation layer are prevented from being separated from the copper foil when stress is exerted, and the connection reliability of the via conductors is secured.

Obviously, numerous modifications and variations of the present invention are possible in light of the above teachings. It is therefore to be understood that within the scope of the appended claims, the invention may be practiced otherwise than as specifically described herein.

What is claimed is:

1. A printed wiring board, comprising:
    a core insulation layer having a plurality of via conductors comprising a plating material filling a plurality of holes formed through the core insulation layer;

a first laminated structure comprising an interlayer insulation layer formed on a first surface of the core insulation layer and having a plurality of via conductors comprising a plating material filling a plurality of holes formed through the interlayer insulation layer in the first laminated structure; and a second laminated structure comprising an interlayer insulation layer formed on a second surface of the core insulation layer on an opposite side of the first surface of the core insulation layer and having a plurality of via conductors comprising a plating material filling a plurality of holes formed through the interlayer insulation layer in the second laminated structure, wherein the interlayer insulation layers in the first and second laminated structures have dielectric constants which are set to be 4.0 or lower for a signal transmission at a frequency of 1 GHz, the core insulation layer comprises a resin material and has a thermal expansion coefficient at or below Tg which is set lower than a thermal expansion coefficient of the interlayer insulation layers at or below Tg, the thermal expansion coefficient of the core insulation layer at or below Tg is set to be 75 ppm/° C. or lower, the via conductors in the interlayer insulation layer of the first laminated structure are stacked on the via conductors in the core insulation layer, respectively, and the via conductors in the interlayer insulation layer of the second laminated structure are stacked on the via conductors in the core insulation layer, respectively.

2. The printed wiring board according to claim 1, wherein the first laminated structure has a first conductive layer interposed between the core insulation layer and the interlayer insulation layer and a second conductive layer formed on the interlayer insulation layer in the first laminated structure, the first conductive layer in the first laminated structure includes a copper foil laminated on the first surface of the core insulation layer and a plated film formed on the copper foil, the second conductive layer in the first laminated structure includes a copper foil laminated on the interlayer insulation layer in the first laminated structure and a plated film formed on the copper foil on the interlayer insulation layer in the first laminated structure, the second laminated structure has a first conductive layer interposed between the core insulation layer and the interlayer insulation layer and a second conductive layer formed on the interlayer insulation layer in the second laminated structure, the first conductive layer in the second laminated structure includes a copper foil laminated on the second surface of the core insulation layer and a plated film formed on the copper foil on the second surface of the core insulation layer, and the second conductive layer in the second laminated structure includes a copper foil laminated on the interlayer insulation layer in the second laminated structure and a plated film formed on the copper foil on the interlayer insulation layer in the second laminated structure.

3. The printed wiring board according to claim 2, wherein the copper foils of the first conductive layers in the first and second laminated structures have thicknesses which are set greater than thicknesses of the copper foils of the second conductive layers in the first and second laminated structures.

4. The printed wiring board according to claim 3, wherein the thicknesses of the copper foils of the first conductive layers in the first and second laminated structures are set at 5 µm or greater.

5. The printed wiring board according to claim 2, wherein at least one of the first conductive layer and second conductive layer in the first laminated structure includes a stripline, and at least one of the first conductive layer and second conductive layer in the second laminated structure includes a stripline.

6. The printed wiring board according to claim 1, wherein each of the interlayer insulation layers in the first and second laminated structure includes a polyphenylene ether resin.

7. The printed wiring board according to claim 6, wherein each of the interlayer insulation layers in the first and second laminated structures includes an inorganic filler, and the thermal expansion coefficient of each of the interlayer insulation layers in the first and second laminated structures at or below Tg is set to be 55 ppm/° C. or lower.

8. The printed wiring board according to claim 1, wherein the first laminated structure has a plurality of interlayer insulations layers including the interlayer resin insulation layer formed on the first surface of the core insulation layer, and the second laminated structure has a plurality of interlayer insulations layers including the interlayer resin insulation layer formed on the second surface of the core insulation layer.

9. The printed wiring board according to claim 8, wherein the plurality of interlayer insulation layers in the first laminated structure has a substantially same dielectric constant and a substantially same thermal expansion coefficient, and the plurality of interlayer insulation layers in the second laminated structure has a substantially same dielectric constant and a substantially same thermal expansion coefficient.

10. The printed wiring board according to claim 1, wherein the core insulation layer has a dielectric constant which is set higher than the dielectric constants of the interlayer insulation layers in the first and second laminated structures.

11. The printed wiring board according to claim 8, wherein the interlayer insulation layers in the first and second laminated structures include interlayer insulation layers which are at same tiers counted from the core insulation layer and which are made of a same material.

12. The printed wiring board according to claim 2, wherein the first conductive layers in the first and second laminated structures have first signal lines, respectively, the second conductive layers in the first and second laminated structures have second signal lines, respectively, the first signal lines are consisted of via lands, respectively, and the second signal lines comprise wiring patterns and via lands, respectively.

13. The printed wiring board according to claim 1, wherein the first laminated structure has a first conductive layer interposed between the core insulation layer and the interlayer insulation layer and a second conductive layer formed on the interlayer insulation layer in the first laminated structure, the first conductive layer in the first laminated structure includes a copper foil laminated on the first surface of the core insulation layer and a plated film formed on the copper foil, and the second conductive layer in the first laminated structure includes a copper foil laminated on the interlayer insulation layer and a plated film formed on the copper foil on the interlayer insulation layer in the first laminated structure.

14. The printed wiring board according to claim 13, wherein the copper foil of the first conductive layer in the first laminated structure has a thickness which is set greater than a thickness of the copper foil of the second conductive layer in the first laminated structure.

15. The printed wiring board according to claim 14, wherein the thickness of the copper foil of the first conductive layer in the first laminated structure is set at 5 µm or greater.

16. The printed wiring board according to claim 13, wherein at least one of the first conductive layer and second conductive layer in the first laminated structure includes a stripline.

17. The printed wiring board according to claim 1, wherein the resin material of the core insulation layer comprises an epoxy resin.

18. The printed wiring board according to claim 1, wherein the core insulation layer comprises a core material and the resin material comprising an epoxy resin impregnating the core material.

19. The printed wiring board according to claim 1, wherein the core insulation layer comprises a core material, the resin material comprising an epoxy resin impregnating the core material and an inorganic filler.

20. The printed wiring board according to claim 17, wherein each of the interlayer insulation layers in the first and second laminated structure includes a polyphenylene ether resin.

* * * * *